United States Patent [19]

Imamura

[11] Patent Number: 5,751,175
[45] Date of Patent: May 12, 1998

[54] CONTROL OF CLOCK SIGNAL IN SEMICONDUCTOR DEVICE

[75] Inventor: Hirohisa Imamura, Tokyo, Japan

[73] Assignee: NEC Corporation, Tokyo, Japan

[21] Appl. No.: 593,500

[22] Filed: Jan. 30, 1996

[30] Foreign Application Priority Data

Jan. 30, 1995 [JP] Japan .................................. 7-013146

[51] Int. Cl.$^6$ ...................................................... H04B 5/06
[52] U.S. Cl. ........................... 327/291; 327/293; 327/294; 327/298
[58] Field of Search ........................... 327/291, 293, 327/294, 298, 299, 99; 331/49

[56] References Cited

U.S. PATENT DOCUMENTS

| | | | |
|---|---|---|---|
| 4,736,162 | 4/1988 | Ishihara | 327/291 |
| 4,901,033 | 2/1990 | Herold et al. | 331/1 A |
| 5,151,613 | 9/1992 | Satou et al. | 327/298 |
| 5,202,647 | 4/1993 | Muraki et al. | 327/291 |
| 5,228,067 | 7/1993 | Ito et al. | 327/293 |
| 5,453,719 | 9/1995 | Narahara | 327/298 |

FOREIGN PATENT DOCUMENTS

| | | | |
|---|---|---|---|
| 1-137820 | 5/1989 | Japan | 327/291 |
| 2-202714 | 8/1990 | Japan | 327/291 |
| 4-361419 | 12/1992 | Japan | 327/298 |
| 6-19698 | 7/1994 | Japan | 327/291 |

OTHER PUBLICATIONS

MCS–48 Family of Single Chip Microcomputers User's Manual, "Single Component System", Sep. 1981.

*Primary Examiner*—Timothy P. Callahan
*Assistant Examiner*—T. T. Lam
*Attorney, Agent, or Firm*—Foley & Lardner

[57] ABSTRACT

In a clock signal control circuit of a semiconductor device, a first clock signal is externally supplied to a first terminal of the semiconductor device in an external clock signal mode. In an external element using mode, a second clock signal is generated on said first terminal by a clocked inverter and a self-biasing resistor composed of a P-channel MOS transistor and N-channel MOS transistor, using elements externally connected between the first terminal and a second terminal of the semiconductor device. The clock signal on said second terminal in the external clock signal mode or the external element using mode is supplied to the internal circuit of the semiconductor device using a Schnmitt trigger type of logic gate. In the external clock signal mode, the clocked inverter and the self-biasing resistor are turned off such that the generation of the second clock signal is inhibited. Further, in a clock signal stop mode, the supply of the clock signal is inhibited.

5 Claims, 6 Drawing Sheets

CONTROL OF CLOCK SIGNAL IN SEMICONDUCTOR DEVICE

BACKGROUND OF THE INVENTION

1. Field of the Invention

The present invention relates to a semiconductor device, and more particularly, to control of a clock signal in a clock signal control circuit included in a semiconductor device.

2. Description of Related Art

Conventionally, there is a semiconductor device including a clock signal control circuit which has a function to generate a clock signal having a predetermined frequency using an externally mounted oscillating section and a function to input a clock signal having a predetermined frequency from an external device. FIG. 1 is a block diagram of a part of such a semiconductor device as a clock signal having a predetermined frequency is generated using an externally coupled oscillation section and supplied to the internal circuit of the semiconductor device. Referring to FIG. 1, a clock signal control circuit 52 of a conventional semiconductor device 51 and an externally mounted oscillating element set are shown but an internal circuit of the semiconductor device 51 is not shown. The clock signal control circuit 52 is composed of an inverter 53 disposed between an oscillation input terminal 78 and an oscillation output terminal 79, a P-channel metal-oxide-semiconductor field effect transistor (to be referred to as "PMOS transistor" hereinafter) 54 and an N-channel metal-oxide-semiconductor field effect transistor (to be referred to as "NMOS transistor" hereinafter) 55 which are both connected in parallel to the inverter 53 and operate as a self-biasing resistor, another inverter 56, a Schmitt trigger type of inverter (to be referred to as "Schmitt trigger inverter" hereinafter) 57, and an NMOS transistor 58. The oscillation element set is externally coupled to the semiconductor device 51 between the terminals 78 and 79. A clock signal is transferred to the internal circuit by the Schmitt trigger inverter 57. The oscillation element set is composed of an oscillation element 59 disposed between the oscillation input terminal 78 and the oscillation output terminal 79, and capacitors 60 and 61 disposed between the ground terminal and the oscillation input terminal 78 and oscillation output terminal 79, respectively.

FIG. 2 is a block diagram of the above clock signal control circuit 52 of the semiconductor device 51 to which a clock signal is externally supplied. Referring to FIG. 2, the clock signal is externally supplied from a clock signal generator 62 to the oscillation input terminal 78. Also, the clock signal is inverted by an inverter 63 and supplied to the oscillation output terminal 79. An internal clock signal is produced from both the clock signal, inverted by the Schmitt trigger inverter 57 and supplied to the internal circuit.

If the external clock signal is supplied to only the oscillation input terminal 78 and is not supplied to the oscillation output terminal 79, the semiconductor device 51 is extremely influenced by noise picked up at the oscillation input terminal 78 since the inverter 53 is not of a Schmitt trigger type. On the contrary, if the external clock signal is supplied to only the oscillation output terminal 79 but is not supplied to the oscillation input terminal 78, the external clock signal supplied to the oscillation output terminal 79 is supplied to the inverter 53 passing through the PMOS transistor 54 and the NMOS transistor 55 and inverted by the inverter 53. As a result, the inverted signal collides with the clock signal supplied to the oscillation output terminal 79 and the clock signal supplied externally is outputted in a distorted form. In order to avoid these problems, it is required to produce two-phase clock signal from the external clock signal and to supply them to the oscillation input terminal 78 and oscillation output terminal 79, as described above.

Next, the operation of the clock signal control circuit 52 in an oscillation stop mode as one of major functions of the semiconductor device 51 will be described below. Generally, a semiconductor device is provided with the oscillation stop mode as a super-suppression power consumption mode by stopping the function of the internal circuit of the semiconductor device by stopping the clock signal. As shown in FIG. 1, in a case where the oscillation element set is externally coupled to generate a clock signal having a predetermined frequency, in the oscillation stop mode, an oscillation stop signal STOP 106 is set to a level of "1" or high level. As a result, the PMOS transistor 54 and NMOS transistor 55 are both set to the OFF state using the inverter 56. Also, the NMOS transistor 58 is set to the ON state. Thus, the oscillation input terminal 78 is fixedly set to the level of "0" or low level and the oscillation output terminal 79 is set to the level of "1" such that the oscillation of the clock signal is stopped. Therefore, the fixed level of "0" is supplied to the internal circuit of the semiconductor device 51 by the Schmitt trigger inverter 57. On the other hand, in a case where the clock signal having a predetermined frequency is externally supplied, the operation of the clock signal control circuit 52 in the oscillation stop mode can be described as in FIG. 1. In this case, the oscillation stop signal STOP 106 is also set to a level of "1" or high level in FIG. 2. As a result, the PMOS transistor 54 and NMOS transistor 55 are both set to the OFF state using the inverter 56. Also, the NMOS transistor 58 is set to the ON state. Thus, the oscillation input terminal 78 is fixedly set to the level of "0" or low level and the oscillation output terminal 79 is set to the level of "1". Therefore, the fixed level of "0" is supplied to the internal circuit of the semiconductor device 51 by the Schmitt trigger inverter 57. This operation is entirely the same as in FIG. 1.

However, even if the clock signal control circuit 52 is set in the oscillation stop mode, the whole of semiconductor device 51 including the clock signal control circuit 52 is not necessarily set in the oscillation stop mode. Further, the clock signal often continues to be supplied from the external clock signal generator 62. In this case, in the oscillation stop mode, since the output of "1" level is supplied from the inverter 53, a PMOS transistor (not shown) constituting the inverter 53 is in the ON state. Thus, since the NMOS transistor 58 is turned on and the output from the inverter 53 collides with the external clock signal, a large amount of current is passed from a power supply to the ground in a case where the "1" level of the clock signal is supplied to the oscillation input terminal 78 and the "0" level of the clock signal is supplied to the oscillation output terminal 79. For this reason, in a case that the external clock signal generator 62 is used, the control operation in the oscillation stop mode cannot always reliably ensured in the conventional clock signal control circuit 52.

Recently, since the low power consumption performance of a semiconductor integrated circuit device is strongly demanded from users, it is absolutely necessary to suppress the large amount of passing current and to ensure the operation in the oscillation stop mode even in a case of using an external clock signal in the clock signal control circuit built in the semiconductor device.

Further, there are strong demands to avoid of an erroneous operation of the semiconductor device by noise generated via power supply lines and ground lines of the semiconductor device due to the internal current. In a case where the external clock signal is used, the inverter 53 in FIG. 2 is unnecessary. However, since the inverter is provided and always operates to be in the level of "1", "0", "1", and so on, the wasteful current flows through the inverter 53 so that noise is generated.

In addition, in a case where the external clock signal is used, the inverted signal of the clock signal needs to be supplied to the oscillation output terminal 79 as well as the clock signal is supplied to the oscillation input terminal 78. Therefore, an inverter 63 must be externally coupled between the oscillation input terminal 78 and oscillation output terminal 79.

SUMMARY OF THE INVENTION

An object of the present invention is to provide a semiconductor device including a clock signal control circuit in which an oscillation stop mode is reliably ensured when an external clock signal is used.

Another object of the present invention is to provide a semiconductor device including a clock signal control circuit in which power consumption can be reduced and noise can be also reduced.

Further another object of the present invention is to provide a semiconductor device including a clock signal control circuit in which an inverter is not to be required to be externally connected when the external clock signal is used.

Still another object of the present invention is to provide a method for the above semiconductor devices including a clock signal control circuit.

In order to achieve an aspect of the present invention, a semiconductor device includes first and second terminals, wherein a first clock signal can be externally supplied to the second terminal, a clock signal generating section connected between the first and second terminals, for generating a second clock signal on the second terminal, using elements externally connected between the first and second terminals, a control section for turning off the clock signal generating section in response to an input control signal, and a supply section operable such that the clock signal on the second terminal is supplied as an internal clock signal to an internal circuit of the semiconductor device. In this example, the clock signal generating section includes a clocked inverter provided between the first and second terminals, and a P-channel MOS transistor and an N-channel MOS transistor functioning as a self-biasing resistor. Further, the supply section includes a Schmitt trigger type of gate. Furthermore, the clock signal control circuit may further includes a clock signal supply section for generating a third clock signal when the first clock signal is not supplied and the second clock signal is not generated, and for supplying the third clock signal as the internal clock signal to the internal circuit of the semiconductor device.

In the clock signal control circuit, a selection signal supply section is further provided to supply a selection signal as the control signal to the control section, the selection signal indicating that the clock signal is supplied to the second terminal. The selection signal may be supplied from a third terminal of the semiconductor device, from a switch set to indicate the selection signal, or a register for storing a data indicative of the selection signal.

For suppression of power consumption, a clock stop signal supply section is preferably provided to stop the supply of the clock signal to the internal circuit of the semiconductor device. In this case, the clock stop signal may be externally supplied to the control section via the fourth terminal or generated by the internal circuit. The control section inhibits the supply section from supplying the internal clock signal to the internal circuit of the semiconductor device in the clock stop signal.

In order to achieve another aspect of the present invention, a method of controlling generation and supply of a clock signal to an internal circuit of a semiconductor device, comprising the steps of:

externally supplying a first clock signal to a first terminal of the semiconductor device in an external clock signal mode;

generating a second clock signal on the first terminal in an external element using mode in which elements are externally connected between the first terminal and a second terminal of the semiconductor device;

supplying the clock signal on the second terminal to the internal circuit of the semiconductor device in the external clock signal mode or in the external element using mode; and inhibiting, in response to a control signal in the external clock signal mode, the second clock signal from being generated.

DESCRIPTION OF THE PREFERRED EMBODIMENTS

A clock signal control circuit built in a semiconductor device according to the present invention will be described below in detail with reference to the accompanying drawings.

Figure 1:
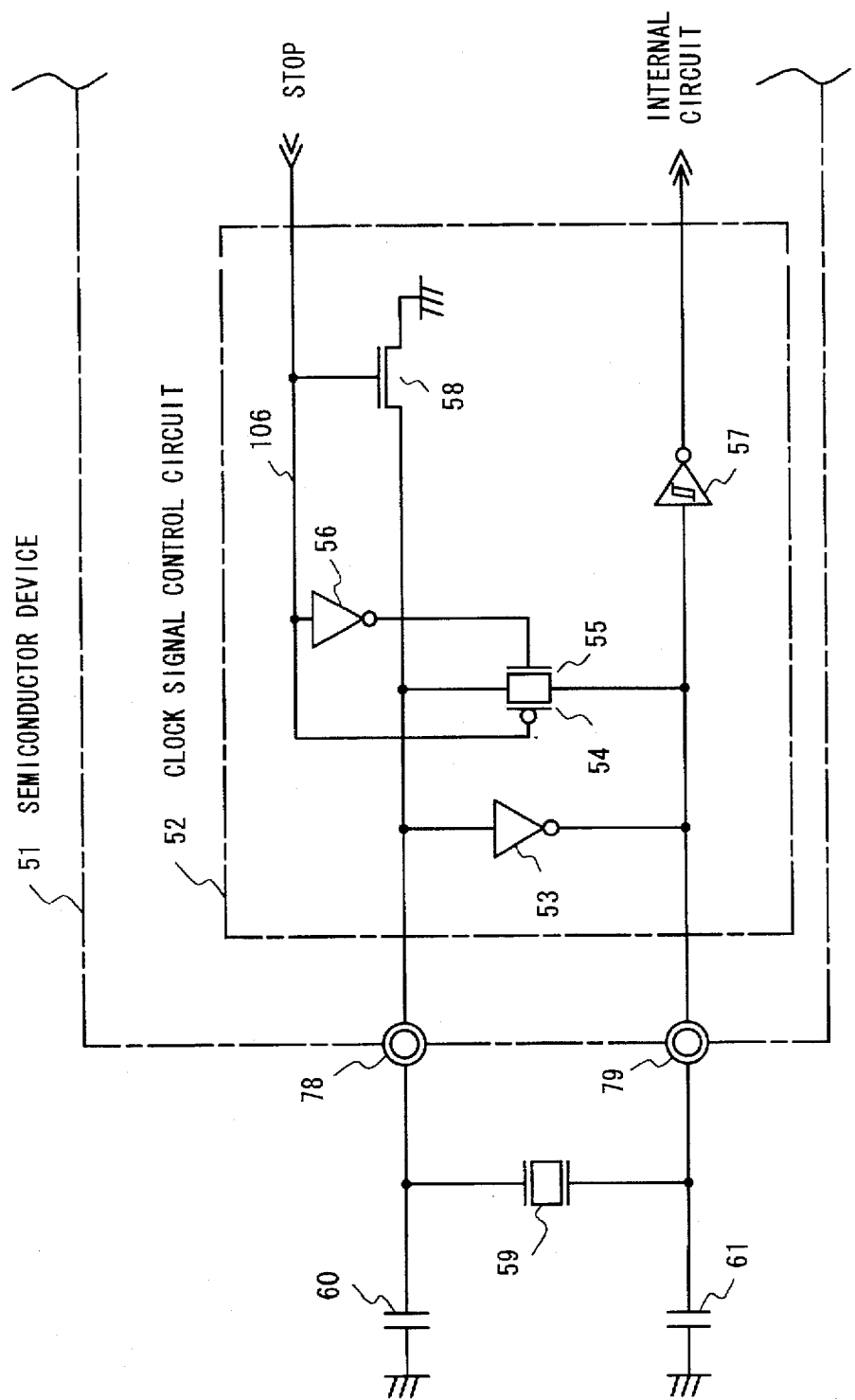
FIG. 1 is a block diagram of a conventional clock signal control circuit of a semiconductor device when an oscillation element is externally coupled to the clock signal control circuit.
Figure 2:
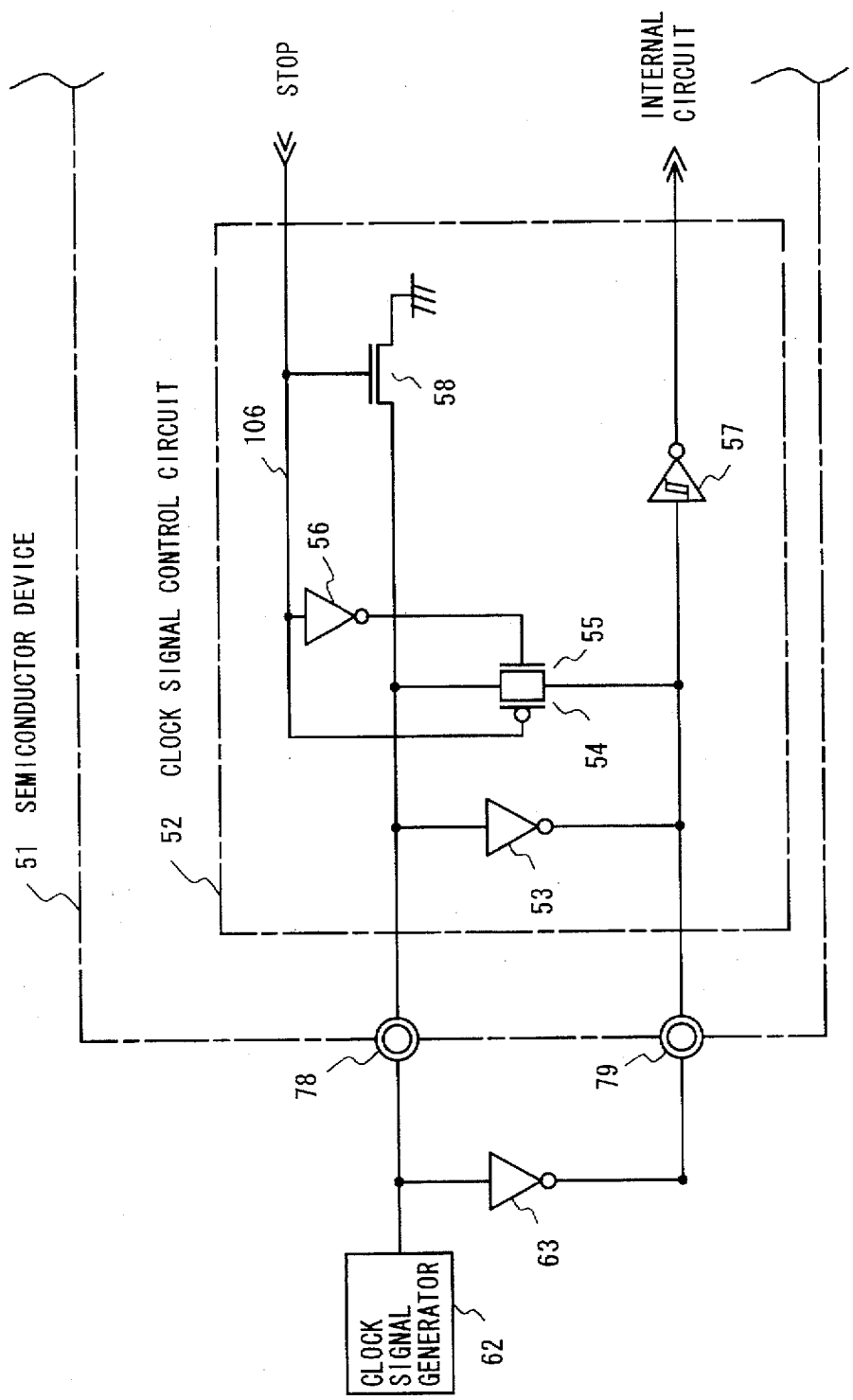
FIG. 2 is a block diagram of the conventional clock signal control circuit shown in FIG. 1 when an external clock signal generator is coupled to the clock signal control circuit.
Figure 3:
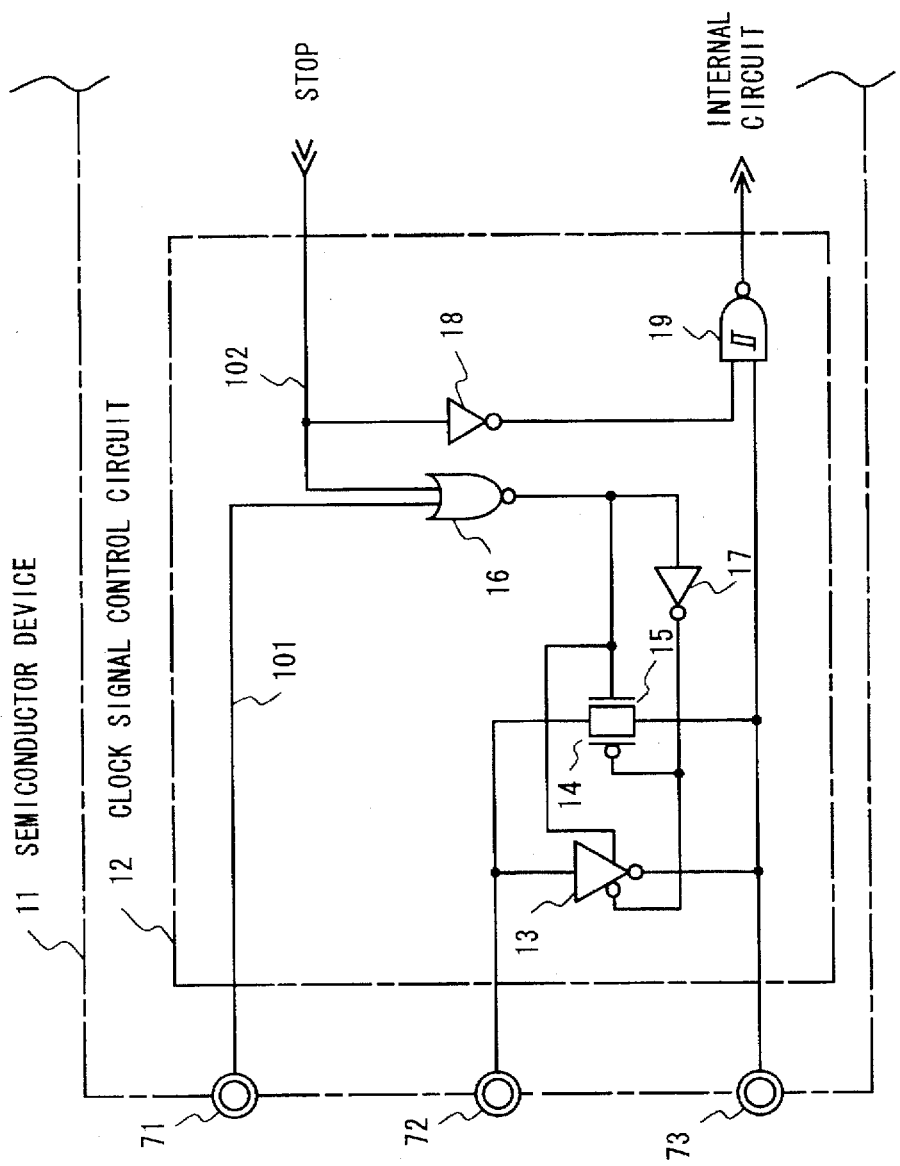
FIG. 3 is a block diagram of a clock signal control circuit of a semiconductor device according to a first embodiment of the present invention, wherein a selection signal is externally supplied.

FIG. 3 is a block diagram of the clock signal control circuit 12 of a semiconductor device 11 according to the first embodiment of the present invention. In the figure an internal circuit and a section for generating an oscillation stop signal STOP are not shown but they would be apparent in the art. Referring to FIG. 3, in the clock signal control circuit, a clocked inverter 13 is provided between an oscillation input terminal 72 and an oscillation output terminal 73. A PMOS transistor 14 and an NMOS transistor 15 are provided in parallel to the clocked inverter 13. The clocked inverter 13 and the PMOS transistor 14 and NMOS transistor 15 function as a clock signal generating section together with the oscillation element 59 coupled between the oscillation input terminal 72 and oscillation output terminal 73 and two capacitors 60 and 61 connected between the ground and these terminals, respectively, as shown in FIG. 1. A terminal 71 to which a selection signal 101 is supplied to designate whether an external clock signal is used is connected to one input of a NOR gate 16. The selection signal 101 is set to a level of "0" or low level when any external clock signal is not used and to a level of "1" or high level when an external clock signal is used. The oscillation stop signal STOP 102 is supplied to the other input of the NOR gate 16 functioning as a control section. The oscillation stop signal is set to a level of "1" or high level in an oscillation stop mode and to a level of "0" or low level otherwise, e.g., in a normal mode. The output of the NOR gate 16 is directly supplied to a gate of the NMOS transistor 15 and a control terminal of the clocked inverter 13, i.e., an NMOS transistor (not shown) constituting the clocked inverter 13. Also, the output of the NOR gate 16 is supplied to an inversion gate of the PMOS transistor 14 and an inversion control terminal of the clocked inverter 13 via an inverter 17, i.e., a PMOS transistor (not shown) constituting the clocked inverter 13. An inverter 18 is connected to the oscillation stop signal STOP 102 and the output of the inverter 18 is supplied to one input of a Schmitt trigger type of NAND gate (to be referred to as "Schmitt trigger NAND gate" hereinafter) 19. The other input of the Schmitt trigger NAND gate 19 is connected to the oscillation output terminal 73.

Next, the operation of the clock signal control circuit according to the first embodiment will be described below. First the operation of the clock signal control circuit in an external element using mode of a normal mode will be described, wherein the oscillation element 59 is coupled between the oscillation input terminal 72 and oscillation output terminal 73 and two capacitors 60 and 61 are connected between the ground and these terminals, respectively, as shown in FIG. 1, such that a clock signal having a predetermined frequency is supplied to the internal circuit of the semiconductor device 11. In the external element using mode of the normal mode, the oscillation stop signal is set to the low level. Also, the selection signal input terminal 71 is set to a low level. Accordingly, the output of the NOR gate 16 is in the high level so that the inverter 17 has the output of low level. Thus, the clocked inverter 13, PMOS transistor 14, and NMOS transistor 15 are all set to the ON state. Since the external oscillation element 59 and capacitors 60 and 61 are connected to the terminals 72 and 73, a clock signal having a predetermined frequency is generated and since the output of the inverter 18 is set to the high level, the generated clock signal is supplied to the internal circuit of the semiconductor device 11 by the Schmitt trigger NAND gate 19.

In a case where an external clock signal is used in a normal mode, that is, in an external clock signal mode of the normal mode, the selection signal of high level is supplied to the terminal 71. As a result, the output of the NOR gate 16 is in the low level and the inverter has the output of high level. Accordingly, the clocked inverter 13, PMOS transistor 14 and NMOS transistor 15 are all set to the OFF state. If the external clock signal is supplied to the terminal 73 under this situation, the external clock signal is supplied to the internal circuit of the semiconductor device 11 by the Schmitt trigger NAND gate 19 because the output of the inverter 18 is in the high level. In this case, since the clocked inverter 13, PMOS transistor 14 and NMOS transistor 15 are all set to the OFF state, the clock signal supplied to the terminal 73 never collides with the output of the clocked inverter 13 even if the external clock signal is supplied to the terminal 72.

Next, the operation of the clock signal control circuit 12 in the oscillation stop mode will be described below. In the oscillation stop mode, the oscillation stop signal STOP 102 is set to the high level. As a result, the output of the NOR gate 16 is set to the low level and the output of the inverter 17 is set to the high level. Accordingly, like the case of using the external clock signal in the normal mode, all the clocked inverter 13, PMOS transistor 14 and NMOS transistor 15 are turned off. Further, since the output of the inverter 18 is set to the low level, the output of the Schmitt trigger NAND gate 19 is fixed to the high level. In a case where the external oscillation element is coupled, the generation of the clock signal is stopped so that the internal circuit of the semiconductor device 11 is supplied with the fixed high level via the Schmitt trigger NAND gate 19. On the other hand, in a case where the external clock signal is supplied to the oscillation output terminal 73, since the output of the clocked inverter 13 is set to the high impedance state, the external clock signal does not collide with the output of the clocked inverter 13. As in a case of the oscillation element externally coupled, the fixed high level is supplied to the internal circuit of the semiconductor device 11 via the Schmitt trigger NAND gate 19.

Figure 4:
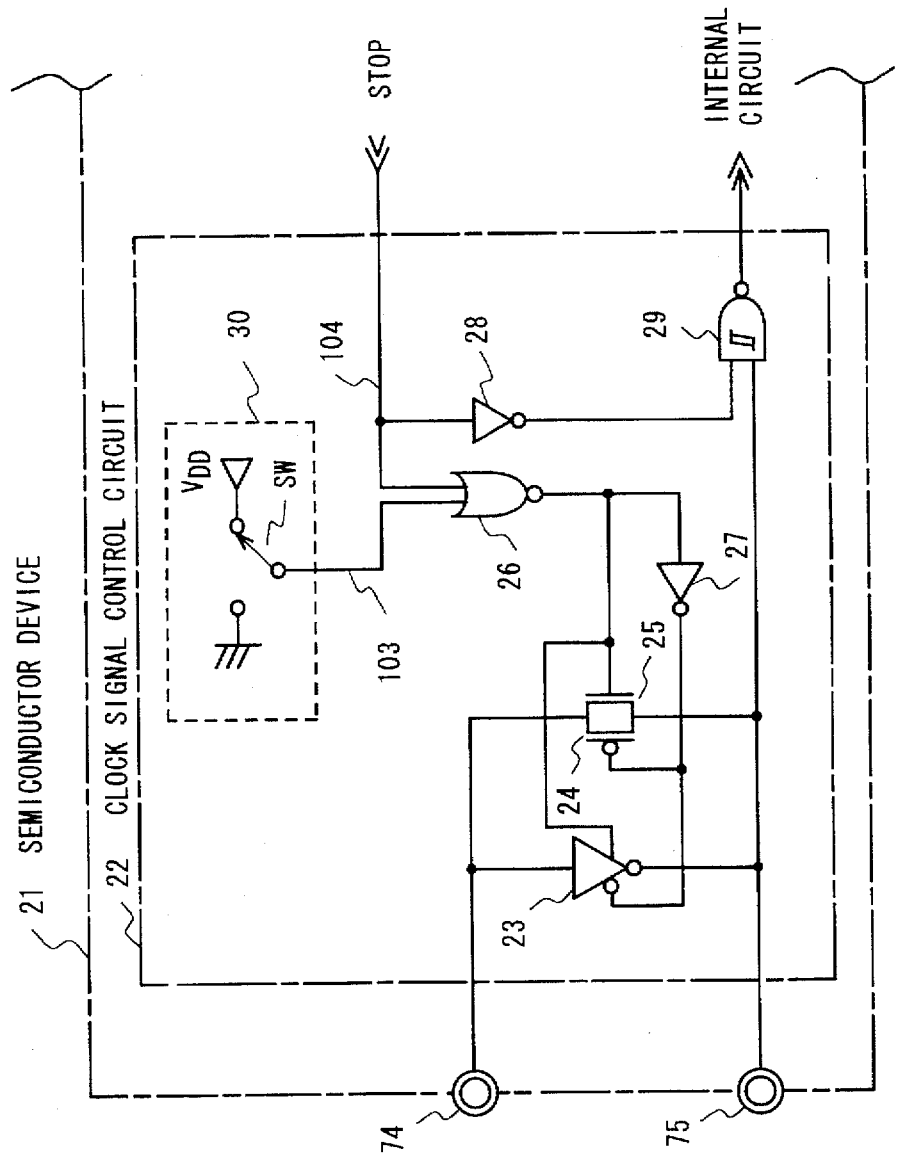
FIG. 4 is a block diagram of a clock signal control circuit of a semiconductor device according to a second embodiment of the present invention, wherein the selection signal is supplied from a switch.

Next, the clock signal control circuit of a semiconductor device according to the second embodiment of the present invention will be described below. FIG. 4 is a block diagram of the clock signal control circuit 22 of a semiconductor device 21 according to the second embodiment of the present invention. In the figure an internal circuit and a section for generating an oscillation stop signal STOP are not shown but they would be apparent in the art. Referring to FIG. 4, in the clock signal control circuit 22, a clocked inverter 23 is provided between an oscillation input terminal 74 and an oscillation output terminal 75. A PMOS transistor 24 and an NMOS transistor 25 are provided in parallel to the clocked inverter 23 for a self-biasing resistor, as in the first embodiment. Unlike the first embodiment, the terminal 71 shown in FIG. 3 is not provided, and instead a mask option 30 is provided which supplies a selection signal 103 to designate whether an external clock signal is used. The mask option 30 includes a switch SW. One contact of the switch is connected to the ground and the other contact is connected to the power supply voltage $V_{DD}$ of the clock signal control circuit 22. A common terminal of the switch SW is connected to the select signal 103. The selection signal 103 is set to a level of "0" or low level when any external clock signal is not used and to a level of "1" or high level when an external clock signal is used. The selection signal 103 is supplied to one input of the NOR gate 26. The oscillation stop signal STOP 104 is supplied to the other input of the NOR gate 26. The oscillation stop signal is set to a level of "1" or high level in an oscillation stop mode and to a level of "0" or low level otherwise. The output of the NOR gate 26 is directly supplied to a gate of the NMOS transistor 25 and a control terminal of the clocked inverter 23, i.e., an NMOS transistor (not shown) constituting the clocked inverter 23. Also, the output of the NOR gate 26 is supplied to an inversion gate of the PMOS transistor 24 and an inversion control terminal of the clocked inverter 23 via an inverter 27, i.e., a PMOS transistor (not shown) constituting the clocked inverter 23. An inverter 28 is connected to the oscillation stop signal STOP 104 and the output of the inverter 28 is supplied to one input of a Schmitt trigger type of NAND gate (to be referred to as "Schmitt trigger NAND gate" hereinafter) 29. The other input of the Schmitt trigger NAND gate 29 is connected to the oscillation output terminal 75.

Next, the operation of the clock signal control circuit according to the second embodiment will be described below. First the operation of the clock signal control circuit 22 in the external element using mode of the normal mode will be described, wherein the oscillation element 59 is coupled between the oscillation input terminal 74 and oscillation output terminal 75 and two capacitors 60 and 61 are connected between the ground and these terminals, respectively, as shown in FIG. 1, such that a clock signal having a predetermined frequency is supplied to the internal circuit of the semiconductor device 21. In the external element using mode of normal mode, the oscillation stop signal is set to the low level. The switch SW of the mask option 30 is switched to connect the common terminal to the ground such that the selection signal of the low level is supplied to the NOR gate 26. The operation in this case is similar to the first embodiment, and therefore the description is omitted. On the other hand, in a case where an external clock signal is used in the normal mode, the switch SW of the mask option 30 is switched to connect the common terminal to the power supply voltage $V_{DD}$ such that the selection signal 103 of high level is supplied to the NOR gate 26. The operation in this case is also the same as that in a case of the external clock signal supplied to the oscillation output terminal 73 in the first embodiment and, therefore, the description is omitted. Further, the operation of the clock signal control circuit 22 in the oscillation stop mode is also the same as in the first embodiment and therefore the description is omitted.

In the second embodiment, the terminal 71 is not required to designate whether the external clock signal is used, unlike the first embodiment. Therefore, the number of terminals of the semiconductor device 21 can be reduced or the terminal 71 in the first embodiment may be used as another function terminal.

Figure 5:
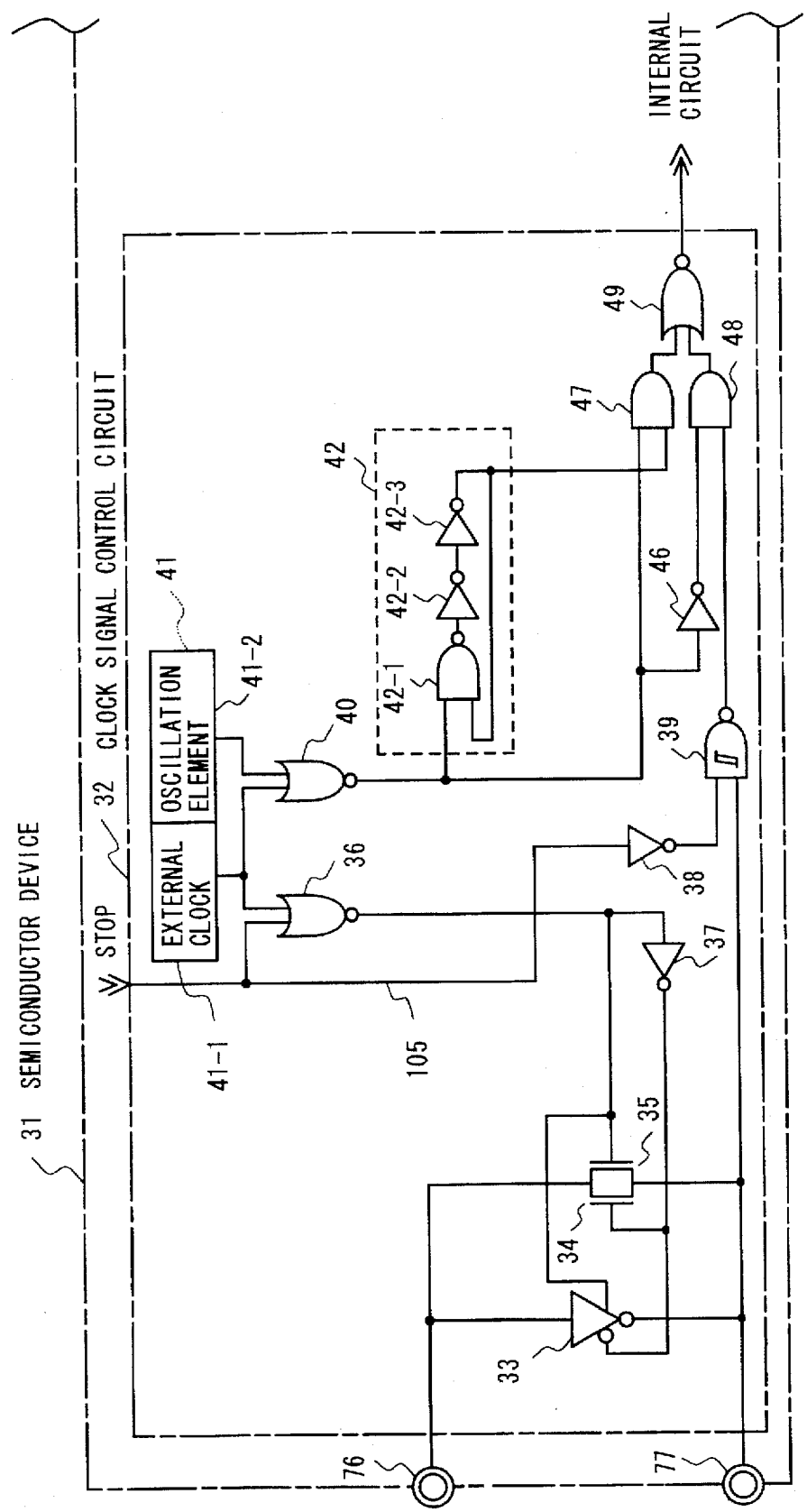
FIG. 5 is a block diagram of a clock signal control circuit of a semiconductor device according to a third embodiment of the present invention, wherein an internal clock generator is provided and the selection signal is supplied from a register section.
Figure 6:
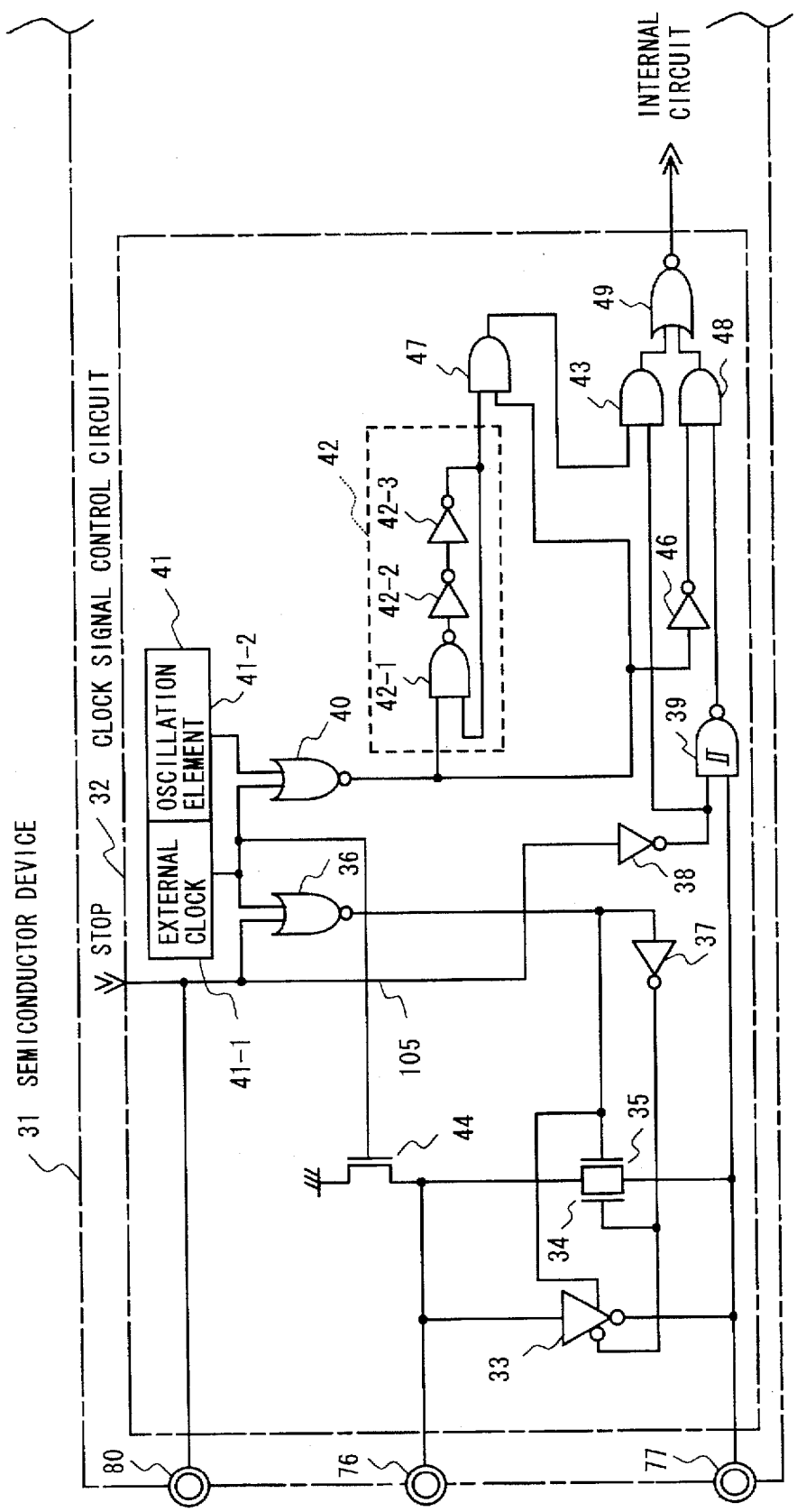
FIG. 6 is a block diagram of a modification of the clock signal control circuit of a semiconductor device according to the third embodiment of the present invention.

Next, the clock signal control circuit 32 of the semiconductor device 31 according to the third embodiment of the present invention will be described below. FIG. 5 is a block diagram of the clock signal control circuit 32 of a semiconductor device 31 according to the third embodiment of the present invention. In the figure an internal circuit and a section for generating an oscillation stop signal STOP are not shown but they would be apparent in the art. Referring to FIG. 5, in the clock signal control circuit 32, a clocked inverter 33 is provided between an oscillation input terminal 76 and an oscillation output terminal 77. A PMOS transistor 34 and an NMOS transistor 35 are provided in parallel to the clocked inverter 33. In order to designate whether a n external clock signal is used, a register section 41 composed of a 1-bit register 41-1 and a 1-bit register 41-2 is provided. The register section 41 is set with data in a well known manner. Both the registers 41-1 and 41-2 are initially set to "0" or a low level. In a case where the external clock signal is used, data of "1" or a high level is written in the register 41-1 and whereas, in a case where the external clock signal is not used, the register 41-1 is remained to be "0". On the other hand, in a case where the oscillation element externally coupled is used, the data of "1" or a high level is written in the register 41-2, whereas, in a case where the oscillation element is not used, the register 41-2 is remained to be "0". Therefore, in a case where no the external clock signal nor the external oscillation element is used, that is, data of "0" is written in the registers 41-1 and 41-2, a clock signal from an internal oscillator to be described latter is designated.

A selection signal is supplied from the register 41-1 to one input of a NOR gate 36 to designate whether the external clock signal is used. The oscillation stop signal STOP 105 is supplied to the other input of the NOR gate 36. The oscillation stop signal is set to a level of "1" or high level in an oscillation stop mode and to a level of "0" or low level otherwise, e.g., in a normal mode. The output of the NOR gate 36 is directly supplied to a gate of the NMOS transistor 35 and a control terminal of the clocked inverter 33, i.e., an NMOS transistor (not shown) constituting the clocked inverter 33. Also, the output of the NOR gate 36 is supplied to an inversion gate of the PMOS transistor 34 and an inversion control terminal of the clocked inverter 33, i.e., a PMOS transistor (not shown) constituting the clocked inverter 33 via an inverter 37. An inverter 38 is connected to the oscillation stop signal STOP 105 and the output of the inverter 38 is supplied to one input of a Schmitt trigger type of NAND gate (to be referred to as "Schmitt trigger NAND gate" hereinafter) 39. The other input of the Schmitt trigger NAND gate 39 is connected to the oscillation output terminal 77.

The registers 41-1 and 41-2 are connected to two inputs of a NOR gate 40 whose output is supplied to a ring oscillator 42, one input of an AND gate 47, and an inverter 46. The ring oscillator 42 is constituted of a NAND gate 43, and inverter 44 and 45 which are connected in series such that the output of the NOR gate 40 is supplied to one input of the NAND gate 43 and the output of the inverter 45 is fed back to the other input of the NAND gate 43. The output of the ring oscillator 42, i.e., the output of the inverter 45 is supplied to the other input of the AND gate 47. The output of the inverter 46 is supplied to an AND gate 48 as well as the output of the Schmitt trigger NAND gate 39. The output of the AND gate 47 and the output of the AND gate 48 are supplied to a NOR gate 49 whose output is connected to an internal circuit of the semiconductor device 31 to supply the clock signal to it.

Next, the operation of the clock signal control circuit according to the third embodiment will be described below. First, the clock signal control circuit 32 is in an initial state, that is, the state in which data of "0" is set in the registers 41-1 and 41-2 of the register section 41. In this case, the output of the NOR gate 40 is set to the "1" or high level such that the ring oscillator 42 starts the operation. The output of the inverter 45 changes to "1", "0", "1", and so on with a predetermined time period to generate an internal clock signal, and is fed back to the input of the NAND gate 43. Since the output of the NOR gate 40 is in the high level, the internal clock signal is supplied to the NOR gate 49 through the AND gate 47. Since the inverted output of the NOR gate 40 is supplied to the AND gate 48 by the inverter 46, the output of the AND gate 48 remains low even if that an oscillation element and capacitors are connected between the oscillation input terminal 76 and the oscillation output terminal 77, an external clock signal is supplied to the terminals 76 and 77, or the oscillation stop signal STOP is in the low or high level. In this manner, when the data of "0" is written in the registers 41-1 and 41-2, the internal clock signal is supplied from the ring oscillator 42 to the internal circuit of the semiconductor device 31 via the NOR gate 49.

In a case where an oscillation element is externally coupled to the clock signal control circuit 32 such that a clock signal having a predetermined frequency is supplied to the internal circuit of the semiconductor device 31, the oscillation element 59 is coupled between the oscillation input terminal 76 and the oscillation output terminal 77 and two capacitors 60 and 61 are connected between the ground and these terminals, respectively, as shown in FIG. 1. In this case, data of "1" is written in the register 41-2 in a well known manner to a person in the art. The register 41-1 remains low. In the normal mode, the oscillation stop signal is set to the low level. Further, the output of the register 41-1 as the selection signal is also in the low level. Accordingly, the output of the NOR gate 36 is in the high level so that the inverter 37 has the output of low level. Thus, the clocked inverter 33, PMOS transistor 34, and NMOS transistor 35 are all set to the ON state. Since the external oscillation element 59 and capacitors 60 and 61 are connected to the terminals 76 and 77 and the output of the inverter 38 is set to the high level, a clock signal having a predetermined frequency is generated and supplied to the AND gate 48 by the Schmitt trigger NAND gate 39. Since the output of the register 41-2 is in the high level, the output of the NOR gate 40 is set to the low level. Accordingly, the ring oscillator 42 does not operates and the AND gate 47 is set to the disable state. On the contrary, the AND gate 48 is set to the enable state such that the clock signal is supplied from the Schmitt trigger NAND gate 48 to the internal circuit of the semiconductor device 31.

In a case where an external clock signal is used in a normal mode such that a clock signal having a predetermined frequency is supplied to the internal circuit of the semiconductor device 31, data of "1" is written in the register 41-1 in a well known manner to a person in the art. The register 41-2 remains low. In the normal mode, the oscillation stop signal is set to the low level. Further, the output of the register 41-1 as the selection signal is also in the high level. As a result, the output of the NOR gate 36 is in the low level and the inverter 37 has the output of high level. Accordingly, the clocked inverter 33, PMOS transistor 34 and NMOS transistor 35 are all set to the OFF state. If the external clock signal is supplied to the terminal 77 under this situation, the external clock signal is supplied to the AND gate 48 by the Schmitt trigger NAND gate 39 because the output of the inverter 38 is in the high level. In this case, since the clocked inverter 33, PMOS transistor 34 and NMOS transistor 35 are all set to the OFF state, the clock signal supplied to the terminal 77 never collides with the output of the clocked inverter 33 even if the external clock signal is supplied to the terminal 76. Since the output of the register 41-1 is in the high level, the output of the NOR gate 40 is set to the low level. Accordingly, the ring oscillator 42 does not operates and the AND gate 47 is set to the disable state. On the contrary, the AND gate 48 is set to the enable state such that the clock signal is supplied from the Schmitt trigger NAND gate 39 to the internal circuit of the semiconductor device 31 via the NOR gate 49.

Next, the operation of the clock signal control circuit 32 in the oscillation stop mode will be described below. In the oscillation stop mode, the oscillation stop signal STOP has the high level. As a result, the output of the NOR gate 36 is set to the low level and the output of the inverter 37 is set to the high level. Accordingly, unlike the case of using the external clock signal in the normal mode, all the clocked inverter 33, PMOS transistor 34 and NMOS transistor 35 are turned off. Further, since the output of the inverter 38 is set to the low level, the output of the Schmitt trigger NAND gate 39 is fixed to the high level. In a case where the external oscillation element is coupled, the generation of the clock signal is stopped so that the internal circuit of the semiconductor device 31 is supplied with the fixed high level via the Schmitt trigger NAND gate 39. On the other hand, in a case where the external clock signal is supplied to the oscillation output terminal 77, since the output of the clocked inverter 33 is set to the high impedance state, the external clock signal does not collide with the output of the clocked inverter 33. As in a case of the oscillation element externally coupled, the fixed high level is supplied to the internal circuit of the semiconductor device 31 via the Schmitt trigger NAND gate 39, the AND gate 48 and the NOR gate 49.

Next, a modification of the third embodiment will be described below. In the modification, a terminal 80 is provided to the semiconductor device 31 and connected to the oscillation stop signal STOP. That is, the oscillation stop signal can be externally supplied. Further, a NMOS 44 is provided between the terminal 76 and the ground and the gate of the NMOS 44 is connected to the register 41-1. That is, when the external clock signal is supplied to the terminal 77, the NMOS 44 is turned on to prevent the terminal 76 from floating. When the oscillation element is connected, since the NMOS is turned off, the generation of a clock signal is performed with no problem. In addition, an AND gate 43 is provided between the AND gate 47 and the NOR gate 49. One input of the AND gate 43 is connected to the output of the AND gate 47 and the other input of the AND gate 43 is connected to the output of the inverter 38. As a result, it is inhibited in the oscillation stop mode the clock signal is supplied from the ring oscillator 42 to the internal circuit of the semiconductor device 31.

As described above, in the present invention, even if the oscillation stop mode is set when the external clock signal is used, since the output of the clocked inverter is held in the high impedance state, the collision of the external clock signal with the output of the clocked inverter can be avoided. Therefore, the oscillation stop mode can be reliably ensured even when the external clock signal is used.

Further, since the inverter in the conventional clock signal control circuit is substituted by the clocked inverter and the clocked inverter is set to the OFF state when the external clock signal is used, the current passing through the inverter in the conventional clock signal control signal when the external clock signal is sued can be avoided so that wasteful power consumption can be eliminated. Also, noise due to the passing current can be reduced.

In addition, according to the present invention, it is sufficient to supply the external clock signal to the oscillation output terminal. Therefore, an inverter which is conventionally required for the external clock signal generator can be removed.

What is claimed is:
1. A semiconductor device comprising:
first and second terminals, wherein a first clock signal is externally supplied to said second terminal in an external clock signal mode;
a clocked inverter connected between said first and second terminals, and set to an OFF state in the external clock signal mode;
a self-biasing resistor including a P-channel MOS transistor and N-channel MOS transistor and set to the OFF state in the external clock signal mode, wherein said clocked inverter and self-biasing resistor generate a second clock signal in a clock signal generation mode using elements externally connected between said first and second terminals;

a Schmitt trigger type gate for supplying to an internal circuit of said semiconductor device the first clock signal in the external clock signal mode and the second clock signal in the clock signal generation mode; and a mode designating section which sets one of the external clock signal mode and the clock signal generation mode in response to a selection signal; and a generating section which generates a third clock signal in an internal clock mode, and wherein said mode designating section sets the internal clock mode based on said selection signal indicating that the external clock signal mode and the clock signal generation mode are not set.

2. A semiconductor device according to claim 1, further comprising a register for storing data indicative of whether the external clock signal mode is used, and wherein said mode designating section sets one of the external clock signal mode and the clock signal generation mode based on said selection signal indicative of the data stored in said register.

3. A semiconductor device according to claim 1, further comprising a switch selectively switched based on whether the external clock signal mode is used, and wherein said mode designating section sets one of the external clock signal mode and the clock signal generation mode based on said selection signal indicative of the setting of said switch.

4. A semiconductor device according to claim 1, further comprising a third terminal to which said selection signal is supplied, and wherein said mode designating section sets one of the external clock signal mode and the clock signal generation mode based on the selection signal.

5. A semiconductor device according to claim 1, wherein said mode designating section further includes an inhibition mode section in which the supply of the first or second clock signal to the internal circuit of said semiconductor device is inhibited.

* * * * *